US012805086B2

(12) United States Patent
Jang et al.

(10) Patent No.: US 12,805,086 B2
(45) Date of Patent: Nov. 17, 2026

(54) DISPLAY DEVICE INCLUDING CONDUCTIVE LAYER ELECTRICALLY CONNECTED TO RECEIVING MEMBER

(71) Applicant: Samsung Display Co., LTD., Yongin-si (KR)

(72) Inventors: Min Jun Jang, Yongin-si (KR); Dong Hyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 445 days.

(21) Appl. No.: 18/466,864

(22) Filed: Sep. 14, 2023

(65) Prior Publication Data

US 2024/0097091 A1 Mar. 21, 2024

(30) Foreign Application Priority Data

Sep. 16, 2022 (KR) ........................ 10-2022-0117350

(51) Int. Cl.

| | |
|---|---|
| ***H01L 33/62*** | (2010.01) |
| ***H01L 25/075*** | (2006.01) |
| ***H01L 33/44*** | (2010.01) |
| ***H01L 33/58*** | (2010.01) |
| ***H10H 20/84*** | (2025.01) |
| ***H10H 20/855*** | (2025.01) |
| ***H10H 20/857*** | (2025.01) |
| ***H10W 90/00*** | (2026.01) |

(52) U.S. Cl.

CPC .......... *H10H 20/857* (2025.01); *H10H 20/84* (2025.01); *H10H 20/855* (2025.01); *H10W 90/00* (2026.01)

(58) Field of Classification Search

CPC ..... H01L 33/62; H01L 25/0753; H01L 33/44; H01L 33/58

See application file for complete search history.

(56) References Cited

U.S. PATENT DOCUMENTS 11,670,243 B2 * 6/2023 Woo ..................... G09G 3/3275 345/204
11,901,346 B2 2/2024 Lee et al.
11,973,072 B2 4/2024 Lee et al.
2023/0163246 A1 5/2023 Lee et al.

FOREIGN PATENT DOCUMENTS

CN 1601349 A * 3/2005 ......... G02F 1/13363
KR 10-0237670 1/2000
KR 10-2022-0007818 A 1/2022
KR 10-2022-0037042 A 3/2022
KR 10-2023-0076913 6/2023

* cited by examiner

*Primary Examiner* — Joseph L Williams

(74) *Attorney, Agent, or Firm* — Womble Bond Dickinson (US) LLP

(57) ABSTRACT

A display device includes a display panel disposed in a receiving member, a circuit board coupled to the display panel, an optical layer on the display panel, a conductive layer on one surface of the optical layer facing the circuit board, and a pad disposed between the conductive layer and the circuit board. The conductive layer contacts the receiving member.

20 Claims, 12 Drawing Sheets

DISPLAY DEVICE INCLUDING CONDUCTIVE LAYER ELECTRICALLY CONNECTED TO RECEIVING MEMBER

CROSS REFERENCE TO RELATED APPLICATION(S)

This application claims priority to and benefits of Korean Patent Application No. 10-2022-0117350 under 35 U.S.C. § 119, filed on Sep. 16, 2022, in the Korean Intellectual Property Office, the entire contents of which are incorporated herein by reference.

BACKGROUND

1. Technical Field

The disclosure relates to a display device.

2. Description of the Related Art

Recently, as interest in information display increases, research and development on a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect to be solved by the disclosure is to provide a display device capable of discharging static electricity.

Aspects of the disclosure are not limited to the object described above, and other technical objects which are not described will be clearly understood by those skilled in the art from the following description.

According to embodiments of the disclosure, a display device may include a display panel disposed in a receiving member, a circuit board coupled to the display panel, an optical layer on the display panel, a conductive layer on one surface of the optical layer facing the circuit board, and a pad disposed between the conductive layer and the circuit board. The conductive layer contacts the receiving member.

The display panel may include a display element layer including a light emitting element, a color filter layer on the display element layer, and an overcoat layer on the color filter layer.

The conductive layer may be disposed between the optical layer and the overcoat layer.

The conductive layer may be electrically connected to the circuit board through the pad.

The receiving member may include a conductive material.

The display panel may include a display area including pixels and a non-display area surrounding at least one side of the display area.

The display device may further include a light blocking pattern overlapping the non-display area in a plan view.

The light blocking pattern may be disposed between the optical layer and the conductive layer.

The display device may further include a protective layer at least partially covering the display panel and the circuit board.

The protective layer may be disposed between the conductive layer and the circuit board.

According to embodiments of the disclosure, a display device may include a display panel disposed in a receiving member, a circuit board coupled to the display panel, an optical layer on the display panel, a conductive layer disposed on one surface of the optical layer and electrically connected to the receiving member, and a pad disposed between the conductive layer and the circuit board. The optical layer may include a first area having a first thickness and a second area having a second thickness less than the first thickness, and the second area of the optical layer overlaps the pad in a plan view.

The display device may further include a light blocking pattern overlapping the second area of the optical layer in a plan view.

The light blocking pattern may be disposed between the optical layer and the conductive layer.

The display device may further include a protective layer disposed between the second area of the optical layer and the circuit board.

The protective layer may at least partially cover the conductive layer.

The display panel may include a display element layer including a light emitting element, a color filter layer on the display element layer, and an overcoat layer on the color filter layer.

The conductive layer may be disposed between the overcoat layer and the optical layer.

The light emitting element may include a first semiconductor layer, a second semiconductor layer, and an active layer disposed between the first semiconductor layer and the second semiconductor layer.

The receiving member may include a conductive material.

The conductive layer may contact the receiving member.

The details of other embodiments may be included in the detailed description and drawings.

According to the above-described embodiment, since static electricity generated in the optical layer may be doubly discharged from the circuit board and the receiving member through the conductive layer, damage due to the static electricity may be minimized.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
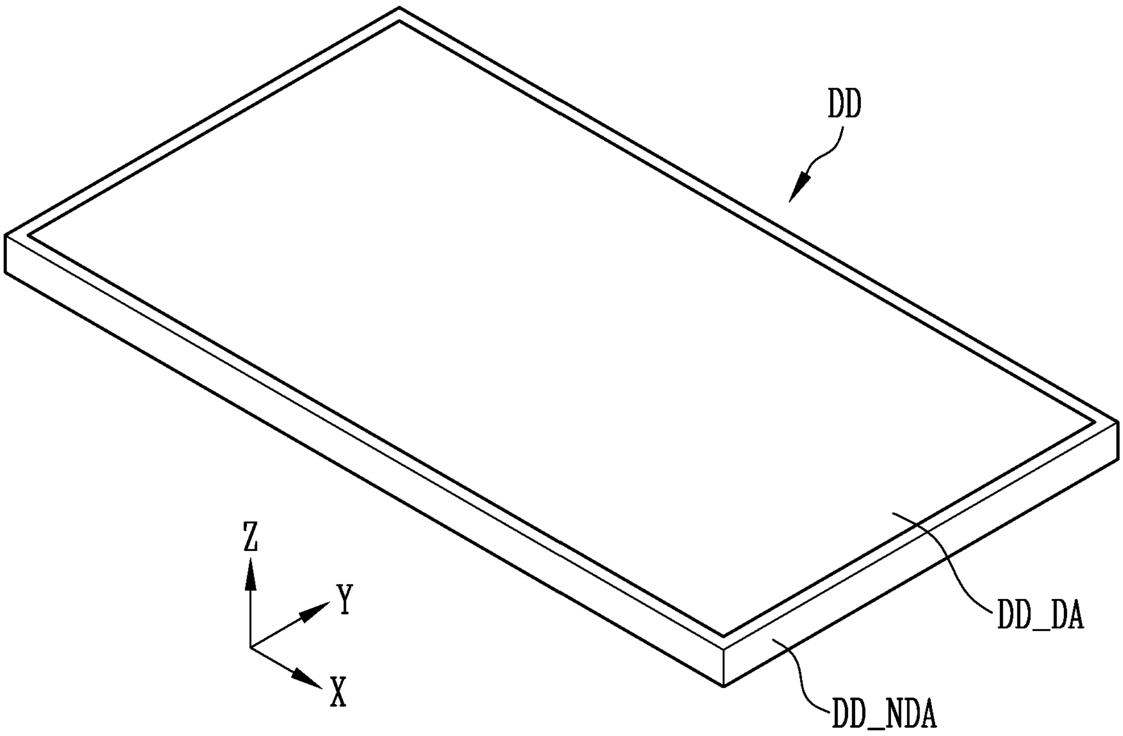
FIG. 1 is a schematic diagram illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and/or like reference characters refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may refer to a physical, electrical and/or fluid connection or coupling, with or without intervening elements.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure and others necessary for those skilled in the art to understand the disclosure will be described in detail with reference to the accompanying drawings. In the following description, the singular expressions include plural expressions unless the context clearly dictates otherwise.

Figure 2:
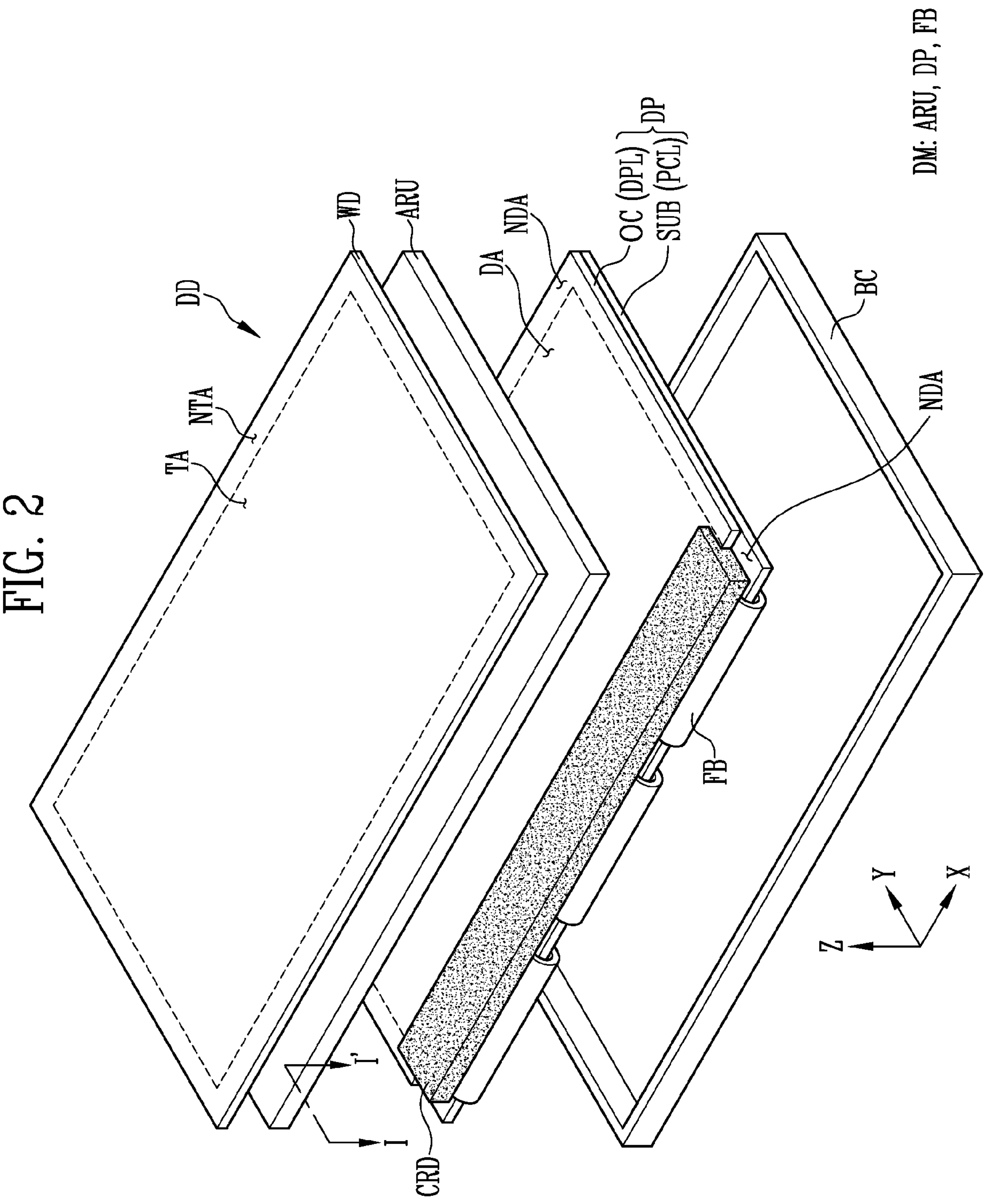
FIG. 2 is a schematic exploded perspective view of a display device according to an embodiment.
Figure 3:
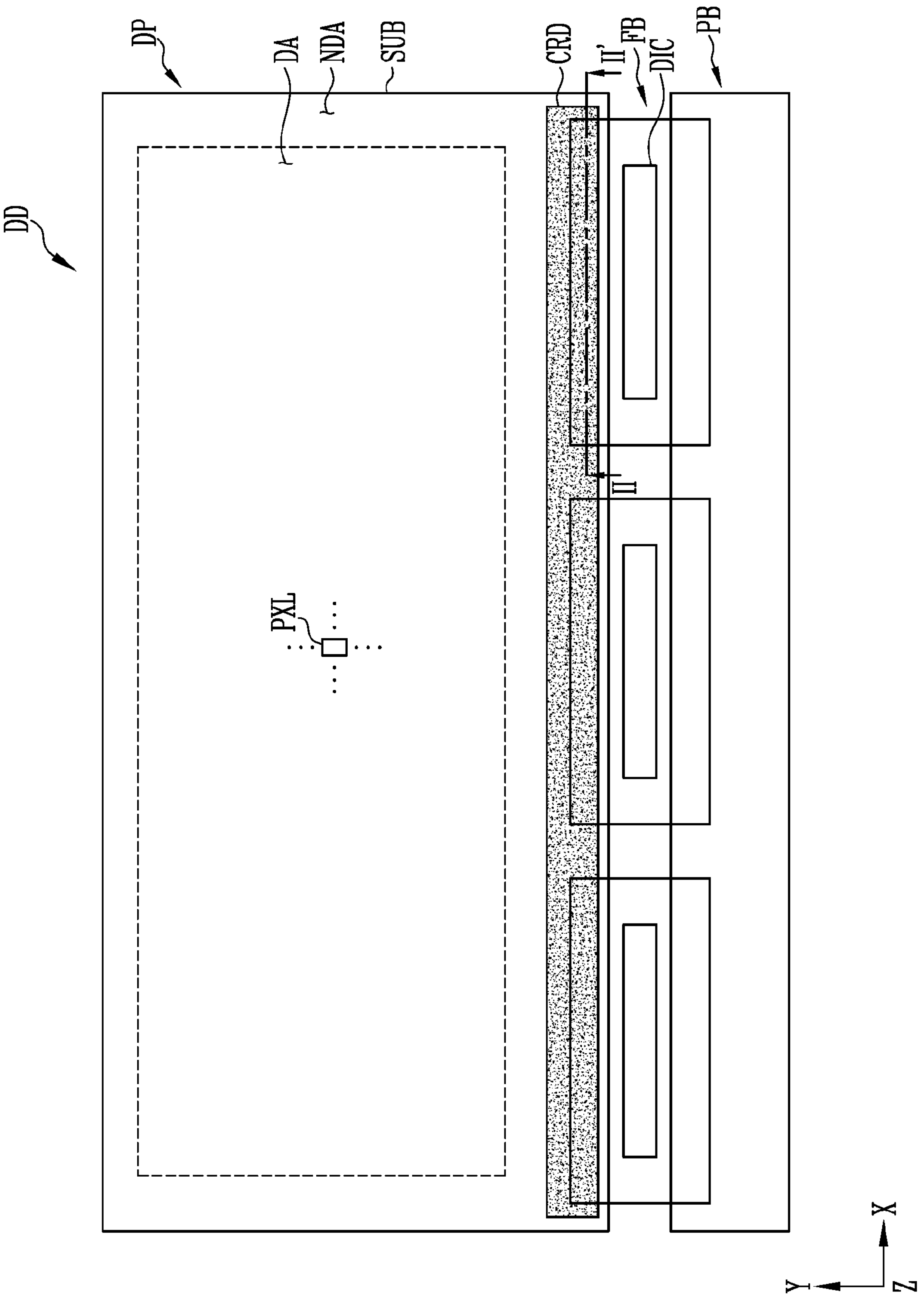
FIG. 3 is a schematic plan view of a display device according to an embodiment.
Figure 4:
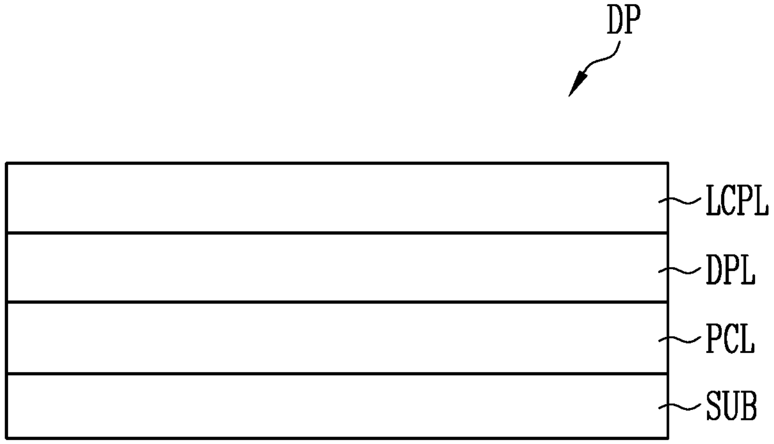
FIG. 4 is a schematic cross-sectional view illustrating a display panel according to an embodiment.
Figure 5:
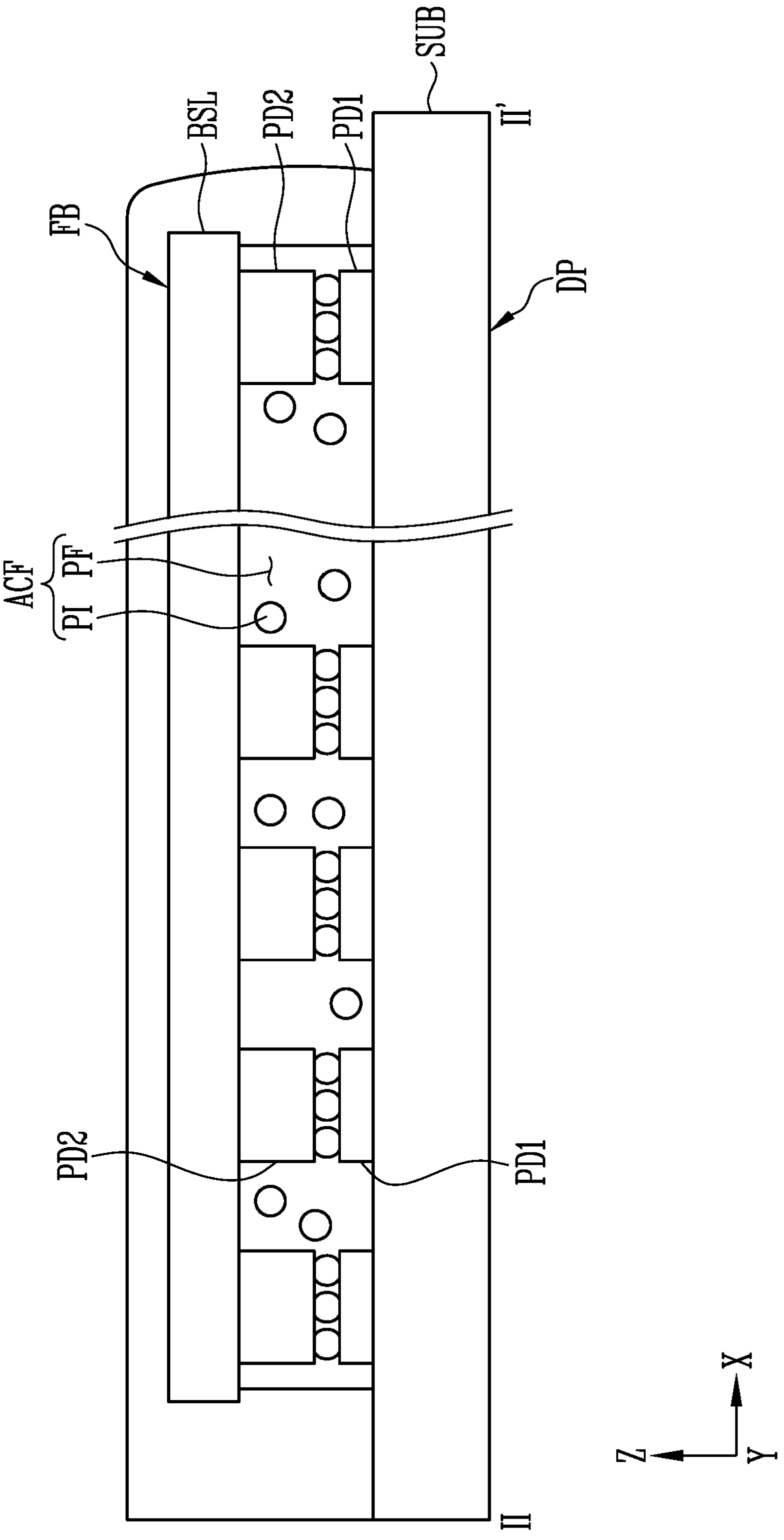
FIG. 5 is a schematic cross-sectional view taken along line II~II' of FIG. 3.

FIG. 1 is a schematic diagram illustrating a display device according to an embodiment. FIG. 2 is a schematic exploded perspective view of a display device according to an embodiment. FIG. 3 is a schematic plan view of a display device according to an embodiment. FIG. 4 is a schematic cross-sectional view illustrating a display panel according to an embodiment. FIG. 5 is a schematic cross-sectional view taken along line II~II' of FIG. 3.

Referring to FIGS. 1 to 5, the display device DD may display an image through a display surface, for example, a display area DD_DA.

In case that the display device DD is an electronic device in which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable, the disclosure may be applied to the display device DD.

The display device DD may be provided in various shapes. For example, the display device DD may be provided in a rectangular plate shape having two pairs of sides parallel to each other, but the disclosure is not limited thereto. In case that the display device DD is provided in the rectangular plate shape, one pair of sides of the two pairs of sides may be provided longer than the other pair of sides. In the drawing, the display device DD has an angled corner portion formed of a straight line, but the disclosure is not limited thereto. According to an embodiment, the display device DD provided in the rectangular plate shape may have a round shape at a corner portion where one long side and one short side contact each other.

In an embodiment of the disclosure, for convenience of description, the display device DD may have a rectangular shape having a pair of long sides and a pair of short sides. An extension direction of the long sides is displayed as a first direction (X-axis direction), an extension direction of the short side is displayed as a second direction (Y-axis direction), and a thickness direction of the display device DD (or a substrate SUB) is displayed as a third direction (Z-axis direction).

In an embodiment of the disclosure, at least a portion of the display device DD may have flexibility, and the display device DD may be folded at a portion having flexibility.

The display device DD may include a display area DD_DA displaying an image and a non-display area DD_NDA provided on at least one side of the display area DD_DA. The non-display area DD_NDA may be an area in which an image is not displayed. However, the disclosure is not limited thereto. According to an embodiment, a shape of the display area DD_DA and a shape of the non-display area DD_NDA may be relatively designed.

According to an embodiment, the display device DD may include a sensing area and a non-sensing area. The display device DD may not only display an image through the sensing area, but may also sense a touch input performed on a display surface (or an input surface) or sense light incident from a front direction. The non-sensing area may surround the sensing area, but embodiments are not limited thereto. According to an embodiment, a partial area of the display area DD_DA may correspond to the sensing area.

The display device DD may include a window WD and a display module DM.

The window WD may be disposed on the display module DM to protect the display module DM from external impact and transmit an image provided from the display module DM through the transmissive area TA. The window WD may include a transmissive area TA and a non-transmissive area NTA.

The transmissive area TA may have a shape corresponding to the display area DD_DA of the display device DD. For example, the image displayed on the display area DD_DA of the display device DD may be viewed from the outside through the transmissive area TA of the window WD.

The non-transmissive area NTA may have a shape corresponding to the non-display area DD_NDA of the display device DD. The non-transmissive area NTA may be an area having light transmittance relatively lower than that of the transmissive area TA. However, the disclosure is not limited thereto, and the non-transmissive area NTA may be omitted.

The window WD may have a multilayer structure selected from a glass substrate, a plastic film, and a plastic substrate. Such a multilayer structure may be formed through a successive process or an adhesion process using an adhesive layer. The entire window WD or a portion of the window WD may have flexibility.

The display module DM may be disposed between the window WD and a receiving member BC. The display module DM may include a display panel DP, a circuit board FB, and an optical layer ARU (or an optical film).

The display panel DP may display an image. As the display panel DP, a display panel capable of self-emission, such as an organic light emitting display panel (OLED panel) using an organic light emitting diode as a light emitting element, and an ultra-small light emitting diode display panel (micro-LED or nano-LED) using an ultra-small light emitting diode as a light emitting element, and a quantum dot organic light emitting display panel (QD OLED panel) using a quantum dot and an organic light emitting diode, may be used. As the display panel DP, a non-emission display panel, such as a liquid crystal display panel (LCD panel), an electro-phoretic display panel (EPD panel), and an electro-wetting display panel (EWD panel), may be used. In case that the non-emission display panel is used as the display panel DP, the display device DD may include a backlight unit that supplies light to the display panel DP.

The display panel DP may include the substrate SUB and pixels PXL provided on the substrate SUB.

The substrate SUB may be formed of one area having an approximately rectangular shape. However, the number of areas provided on the substrate SUB may be different from the above-described example, and the shape of the substrate SUB may have a different shape according to the area provided on the substrate SUB.

The substrate SUB may be formed of an insulating material such as glass or resin. The substrate SUB may be formed of a material having flexibility to be bent or folded, and may have a single-layer structure or a multilayer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB is not limited to the above-described embodiments.

The substrate SUB may include a display area DA and a non-display area NDA. The display area DA may be an area in which the pixels PXL are provided to display an image, and the non-display area NDA may be an area in which the pixels PXL are not provided and may be an area in which an image is not displayed. For convenience, only one pixel PXL is shown in FIG. 3, but multiple pixels PXL may be provided in the display area DA of the substrate SUB.

The display area DA of the substrate SUB (or the display panel DP) may correspond to the display area DD_DA of the display device DD, and the non-display area NDA of the substrate SUB (or the display panel DP) may correspond to the non-display area DD_NDA of the display device DD. The non-display area NDA may correspond to a bezel area of the display device DD.

The non-display area NDA may be provided on at least one side of the display area DA. The non-display area NDA may surround a circumference (or an edge) of the display area DA. In the non-display area NDA, a line unit connected to the pixels PXL and a driver connected to the line unit and driving the pixels PXL may be provided.

The line unit may electrically connect the driver and the pixels PXL. The line unit may provide a signal to each pixel PXL and may be a fan-out line connected to signal lines connected to each pixel PXL, for example, a scan line, a data line, and the like.

Multiple first pads PD1 may be positioned on one surface of the substrate SUB. The first pads PD1 may be disposed in the non-display area NDA.

The pixels PXL may be provided in the display area DA of the substrate SUB. Each of the pixels PXL may be a minimum unit for displaying an image. The pixels PXL may include a light emitting element emitting white light and/or color light. Each of the pixels PXL may emit any one color among red, green, and blue, but is not limited thereto, and may emit cyan, magenta, yellow, or the like.

The pixels PXL may be arranged in a matrix form along a row extending in the first direction (X-axis direction) and a column extending in the second direction (Y-axis direction) crossing the first direction (X-axis direction). However, an arrangement form of the pixels PXL is not limited, and the pixels PXL may be arranged in various forms. The pixels PXL have a rectangular shape in the drawing, but the disclosure is not limited thereto, and the pixels PXL may be modified into various shapes. In case that pixels PXL are provided, the pixels PXL may be provided to have different areas (or sizes). For example, in a case of pixels PXL having different colors of emitted light, the pixels PXL may be provided in different areas (or sizes) or in different shapes for each color.

The driver may control driving of the pixel PXL by providing a signal and power to each pixel PXL through the line unit.

As shown in FIG. 4, the display panel DP may include a pixel circuit layer PCL, a display element layer DPL, and a light conversion pattern layer LCPL.

The pixel circuit layer PCL may be provided on the substrate SUB and may include transistors and signal lines connected to the transistor. For example, each transistor may have a form in which a semiconductor layer, a gate electrode, a first terminal, and a second terminal are sequentially stacked with an insulating layer interposed therebetween. The semiconductor layer may include amorphous silicon, poly silicon, low temperature poly silicon, and an organic semiconductor. The gate electrode, the first terminal, and the second terminal may include one of aluminum (Al), copper (Cu), titanium (Ti), and molybdenum (Mo), but the disclosure is not limited thereto. The pixel circuit layer PCL may include one or more insulating layers.

The display element layer DPL may be disposed on the pixel circuit layer PCL. The display element layer DPL may include a light emitting element emitting light. The light emitting element may be, for example, an organic light emitting diode, but the disclosure is not limited thereto. According to an embodiment, the light emitting element may be an inorganic light emitting element including an inorganic light emitting material or a light emitting element that emits light by changing a wavelength of light emitted using a quantum dot.

The light conversion pattern layer LCPL may be disposed on the display element layer DPL. The light conversion pattern layer LCPL may change a wavelength (or a color) of light emitted from the display element layer DPL by using a quantum dot, and may selectively transmit light of a specific wavelength (or a specific color) by using a color filter. The light conversion pattern layer LCPL may be formed through a successive process on a base surface provided by the display element layer DPL.

As will be described later with reference to FIG. 6, an overcoat layer OC may configure an uppermost layer of the display panel DP. The overcoat layer OC may have a form of an encapsulation layer formed of a multilayer. The overcoat layer OC may include an inorganic layer and/or an organic layer. For example, the overcoat layer OC may have a form in which an inorganic layer, an organic layer, and an inorganic layer are sequentially stacked. The overcoat layer OC may prevent external air and moisture from penetrating into the display element layer DPL and the pixel circuit layer PCL.

The circuit board FB may be connected to one end (or one side surface) of the display panel DP to provide a driving signal and a voltage to the display panel DP. For example, the driving signal may be a signal for displaying an image from the display panel DP, and the voltage may be a driving voltage necessary for driving the display panel DP. The circuit board FB may be provided as a flexible printed circuit board (FPCB). As shown in FIG. 2, the circuit board FB may be folded along one side surface of the display panel DP and positioned on a rear surface of the display panel DP. The circuit board FB may be electrically connected to a conductive layer CL of FIG. 8. Accordingly, static electricity transferred to the conductive layer CL may be discharged from the circuit board FB. A detailed description of the conductive layer CL is described later with reference to FIG. 8.

The circuit board FB may process various signals input from the printed circuit board PB and output the processed various signals to the display panel DP. To this end, the circuit board FB may be attached each of to the display panel DP and the printed circuit board PB. For example, one end (or the one side surface) of the circuit board FB may be bonded to the display panel DP by a conductive adhesive member ACF, and another end (or another side surface) of the circuit board FB facing the one end may be bonded to the printed circuit board PB by another conductive adhesive member (not shown). The conductive adhesive member ACF and the other conductive adhesive member may include an anisotropic conductive film.

The conductive adhesive member ACF may include conductive particles PI formed in an adhesive film PF having an adhesive property. The conductive particles PI may electrically connect first pads PD1 of the display panel DP and second pads PD2 of the circuit board FB. Accordingly, signals or a voltage of driving power transferred to the second pads PD2 through a driver DIC mounted on the circuit board FB may be transferred to the first pads PD1 of the display panel DP through the conductive adhesive member ACF.

The first pads PD1 may be provided in a pad area positioned in the non-display area NDA of the substrate SUB. The second pads PD2 may be provided on a base layer BSL of the circuit board FB.

The driver DIC may be positioned on the circuit board FB. The driver DIC may be an integrated circuit (IC). The driver DIC may receive driving signals output from the printed circuit board PB, and may output a signal, a driving voltage (or driving power), and the like to be provided to the pixels PXL, based on the received driving signals. The above-described signals and driving voltage may be transferred to the first pads PD1 on the display panel DP through the second pads PD2 on the circuit board FB.

In the above-described embodiment, the driver DIC is disposed on the circuit board FB, but the disclosure is not limited thereto. According to an embodiment, the driver DIC may be disposed (or mounted) on the substrate SUB of the display panel DP.

The printed circuit board PB may generate overall driving signals and power signals necessary for driving the display panel DP and provide the driving signals and power signals to the display panel DP. The printed circuit board PB may include a pad (not shown). The pad may be electrically connected to the pads of the circuit board FB. As a result, the driving signals and the power signals may be transferred from the printed circuit board PB to the driver DIC through the circuit board FB.

The printed circuit board PB may be configured in various forms. For example, the printed circuit board PB may be configured by stacking at least one layer of copper foil on one surface or both surfaces of a base substrate formed of an epoxy resin or the like, and may be configured by stacking at least one layer of copper foil on one surface or both surfaces of a plastic film having flexibility. The printed circuit board PB may be formed in a multilayer structure in which a copper foil is formed inside the base substrate.

The optical layer ARU may be disposed on the display panel DP and the circuit board FB. The optical layer ARU may reduce external light reflection. The optical layer ARU may be an anti-reflection layer including a polarization film and/or a retardation film. The number of retardation films and a retardation length (λ/4 or λ/2) of the retardation film may be determined according to an operation principle of the optical layer ARU.

The receiving member BC may be coupled to the window WD. The receiving member BC may provide a rear surface of the display device DD and may be coupled to the window WD to define an internal space. The receiving member BC may include a material having a relatively high rigidity. The receiving member BC may include a conductive material. For example, the receiving member BC may include frames and/or plates formed of a conductive material such as aluminum. The receiving member BC may be electrically connected to the conductive layer CL of FIG. 8. Accordingly, static electricity transferred to the conductive layer CL may be discharged from the receiving member BC. A detailed description of the conductive layer CL is described later with reference to FIG. 8.

The receiving member BC may stably protect configurations of the display device DD received in the internal space from external impact. The receiving member BC includes a material having high rigidity, but the disclosure is not limited thereto, and the receiving member BC may include a flexible material. Although not shown, the display device DD according to an embodiment of the disclosure may have a characteristic in which the display device DD may be folded or bent. Configurations included in the display device DD may also have a flexible property.

In an embodiment, the display device DD (or the display module DM) may further include an upper protective layer CRD (a protective layer, or a protective unit) that at least partially covers the circuit board FB and the display panel DP.

The upper protective layer CRD may cover one side surface of each of the circuit board FB and the display panel DP to prevent corrosion or the like of pads of each of the circuit board FB and the display panel DP. The upper protective layer CRD may cover one side surface of each of the circuit board FB and the display panel DP to block external water, moisture, or the like from flowing into the pixels PXL. The upper protective layer CRD may further firmly couple the circuit board FB and the display panel DP bonded to each other.

In an embodiment, the upper protective layer CRD may be formed of a resin. For example, the upper protective layer CRD may be formed of a thermosetting resin including a thermal polymerization initiator that initiates a curing reaction by heat. According to an embodiment, the upper protective layer CRD may be formed of a light-curable resin including a photopolymerization initiator that is crosslinked and cured by light such as ultraviolet light or infrared light. According to an embodiment, the upper protective layer CRD may include a light blocking material. The circuit board FB positioned under the upper protective layer CRD may be prevented from being viewed. In an embodiment, the upper protective layer CRD may partially overlap the overcoat layer OC of the display panel DP in the third direction (Z-axis direction) (or in a plan view).

Figure 6:
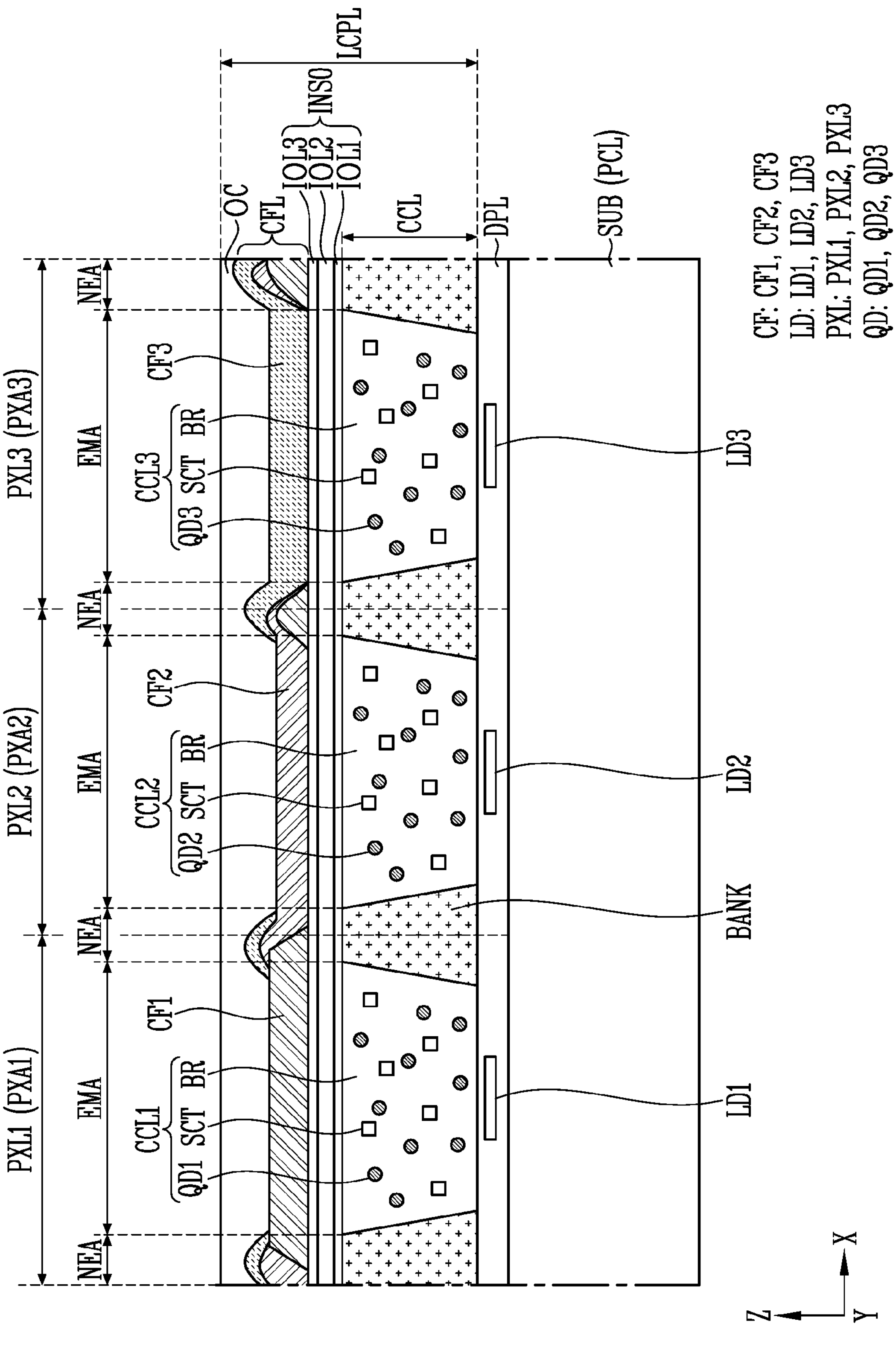
FIG. 6 is a schematic cross-sectional view illustrating a display panel according to an embodiment.

FIG. 6 is a schematic cross-sectional view illustrating a display panel according to an embodiment. In FIG. 6, the display panel DP is shown based on the display area DA.

Referring to FIG. 6, a first pixel PXL1, a second pixel PXL2, and a third pixel PXL3 may be disposed on the substrate SUB. The first to third pixels PXL1, PXL2, and PXL3 may constitute one unit pixel, but the disclosure is not limited thereto.

According to an embodiment, the first to third pixels PXL1, PXL2, and PXL3 may emit light in different colors. For example, the first pixel PXL1 may be a red pixel emitting red light, the second pixel PXL2 may be a green pixel emitting green light, and the third pixel PXL3 may be a blue pixel emitting blue light. However, the color, type, number, and/or the like of pixels configuring the unit pixel are/is not limited, and, for example, the color of light emitted by each of the pixels may be variously changed. According to an embodiment, the first to third pixels PXL1, PXL2, and PXL3 may emit light in the same color. For example, each of the first to third pixels PXL1, PXL2, and PXL3 may be a blue pixel emitting blue light.

In an embodiment of the disclosure, unless otherwise specified, "formed and/or provided on the same layer" may mean formed in the same process, and "formed and/or provided on different layers" may mean formed in different processes.

The pixel circuit layer PCL and the display element layer DPL may be disposed on the substrate SUB. For convenience of description, the pixel circuit layer PCL is shown together with the substrate SUB, but as described with reference to FIG. 4, the pixel circuit layer PCL may be disposed between the substrate SUB and the display element layer DPL.

The display element layer DPL may include a light emitting element LD provided in each emission area EMA. For example, a first light emitting element LD1 may be provided in a first pixel area PXA1, a second light emitting element LD2 may be provided in a second pixel area PXA2, and a third light emitting element LD3 may be provided in a third pixel area PXA3.

The light emitting element LD may include an organic light emitting diode, or an inorganic light emitting diode such as a quantum dot light emitting diode. In an embodiment, the light emitting element LD may be an ultra-small light emitting diode, for example, having a size as small as a nano scale to a micro scale, using a material of an inorganic crystal structure. The light emitting elements LD may be connected to each other in parallel and/or in series with the light emitting element LD disposed adjacently in each pixel PXL, but the disclosure is not limited thereto. The light emitting element LD may configure a light source of each pixel PXL. In other words, each pixel PXL may include at least one light emitting element LD driven by a signal (for example, a scan signal and a data signal) and/or power (for example, first driving power and second driving power). A detailed configuration of the pixel circuit layer PCL and the display element layer DPL is described later with reference to FIG. 7.

The light conversion pattern layer LCPL may include a color conversion layer CCL, an insulating layer INS0 (or a refractive index conversion layer), a color filter layer CFL (or a color filter CF), and an overcoat layer OC.

The color conversion layer CCL may include a bank BANK and first to third color conversion patterns CCL1, CCL2, and CCL3 (or first to third color conversion layers).

The bank BANK may be disposed on the display element layer DPL. The bank BANK may be positioned in a non-emission area NEA of the first to third pixels PXL1, PXL2, and PXL3. The bank BANK may be formed between the first to third pixels PXL1, PXL2, and PXL3 to surround each emission EMA, and may define each emission area EMA of each of the first to third pixels PXL1, PXL2, and PXL3. The bank BANK may prevent a solution for forming the first to third color conversion patterns CCL1, CCL2, and CCL3 in the emission area EMA from flowing into the emission area EMA of an adjacent pixel, or may function as a dam structure that controls an amount (e.g., a predetermined or selectable amount) of solution to be supplied to each emission area EMA.

An opening for exposing the display element layer DPL may be formed in the bank BANK to correspond to the emission area EMA. The first to third color conversion patterns CCL1, CCL2, and CCL3 may be disposed in each opening of the bank BANK.

The first to third color conversion patterns CCL1, CCL2, and CCL3 may include a base resin BR, color conversion particles QD, and light scattering particles SCT. The base resin BR may have high light transmittance and an excellent dispersion characteristic for the color conversion particles QD. For example, the base resin BR may include an organic material such as an epoxy-based resin, an acryl-based resin, a cardo-based resin, or an imide-based resin.

The color conversion particles QD may convert light of a color emitted from the light emitting element LD disposed in one pixel into light of a specific color. For example, in case that the first pixel PXL1 is a red pixel, the first color conversion layer CCL1 may include first color conversion particles QD1 of a red quantum dot converting light emitted from the first light emitting element LD1 into red light. As another example, in case that the second pixel PXL2 is a green pixel, the second color conversion layer CCL2 may include second color conversion particles QD2 of a green quantum dot converting light emitted from the second light emitting element LD2 into green light. As still another example, in case that the third pixel PXL3 is a blue pixel, the third color conversion layer CCL3 may include third color conversion particles QD3 of a blue quantum dot converting light emitted from the third light emitting device LD3 into blue light. In an embodiment, in case that the third light emitting element LD3 emits blue light, the third color conversion layer CCL3 may not include the third color conversion particles QD3.

The light scattering particles SCT may have a refractive index different from that of the base resin BR and form an optical interface with the base resin BR. The light scattering particles SCT may be metal oxide particles or organic particles. According to an embodiment, the light scattering particles SCT may be omitted.

The insulating layer INS0 may be disposed on the color conversion layer CCL. The insulating layer INS0 may be entirely disposed on the substrate so as to cover the color conversion layer CCL (that is, the bank BANK and the first to third color conversion patterns CCL1, CCL2, and CCL3).

The insulating layer INS0 may include at least three insulating layers, and may recycle light (for example, light proceeding in an oblique direction) emitted from the color conversion layer CCL using a refractive index difference (or total reflection due to the refractive index difference) between the three insulating layers. For example, the light totally reflected by the insulating layer INS0 may be reflected again in the third direction (Z-axis direction) by the display element layer DPL (or an electrode included in the display element layer DPL and having a specific reflectance), or may be scattered in the third direction (Z-axis direction) by the color conversion layer CCL (for example, the light scattering particle SCT). Therefore, efficiency (external quantum efficiency, or light output efficiency) of light finally emitted from the pixel PXL through the insulating layer INS0 or an emission luminance of the pixel PXL may be improved.

In embodiments, the insulating layer INS0 may include a first inorganic layer IOL1 (or a first dense film), a second inorganic layer IOL2 (or a low refractive film), and a third inorganic layer IOL3 (or a second dense film) sequentially stacked on the color conversion layer CCL.

The first inorganic layer IOL1 may be disposed on the color conversion layer CCL, and may prevent moisture (or a solution used in a subsequent process) from penetrating into the color conversion layer CCL thereunder. The second inorganic layer IOL2 may be disposed on the first inorganic layer IOL1, and may totally reflect the light (for example, the light proceeding in an oblique direction) emitted from the color conversion layer CCL using a refractive index difference with the first inorganic layer TOLL The third inorganic layer IOL3 may be disposed on the second inorganic layer IOL2 and may improve adhesion force between the second inorganic layer IOL2 and the color filter layer CFL thereon.

The color filter layer CFL may be disposed on the insulating layer INS0. The color filter layer CFL may include a color filter material that selectively transmits light of a specific color converted by the color conversion layer CCL. The color filter layer CFL may include a red color filter, a green color filter, and a blue color filter. For example, in case that the first pixel PXL1 is a red pixel, a first color filter CF1 that transmits red light may be disposed on the first pixel PXL1. In case that the second pixel PXL2 is a green pixel, a second color filter CF2 that transmits green light may be disposed on the second pixel PXL2. In case that the third pixel PXL3 is a blue pixel, a third color filter CF3 that transmits blue light may be disposed on the third pixel PXL3.

The overcoat layer OC may be disposed on the color filter layer CFL. The overcoat layer OC may be entirely disposed on the substrate SUB to cover a lower configuration, and may encapsulate the display area DA of the display panel DP.

Figure 7:
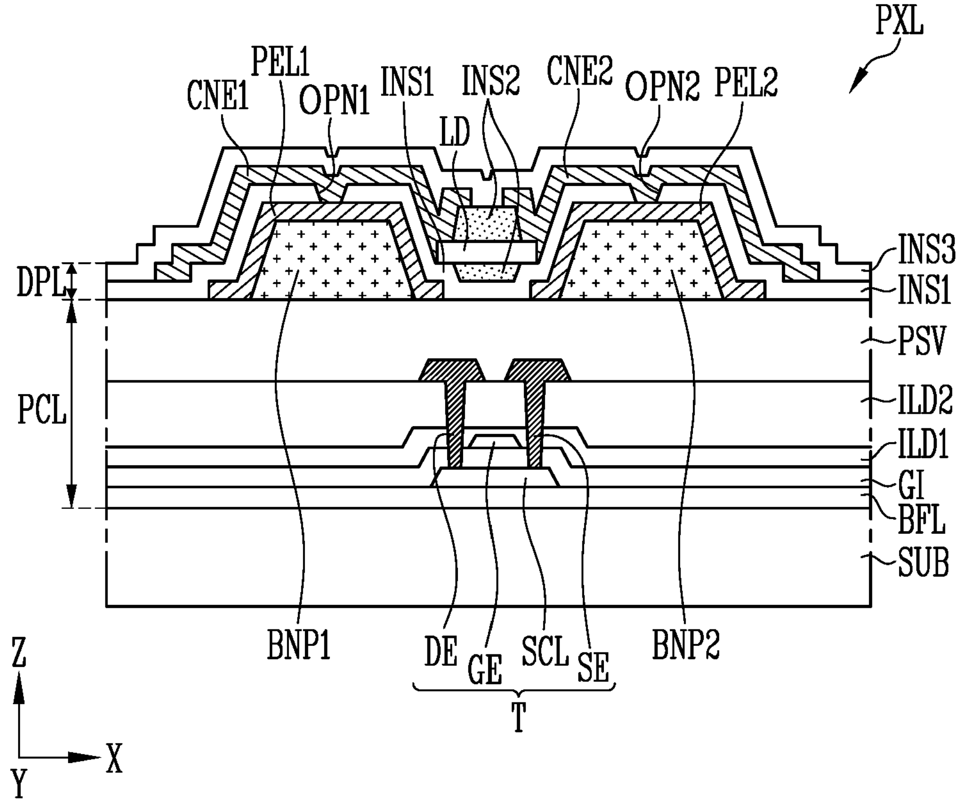
FIG. 7 is a schematic cross-sectional view illustrating a pixel circuit layer and a display element layer according to an embodiment.

FIG. 7 is a schematic cross-sectional view illustrating a pixel circuit layer and a display element layer according to an embodiment. In FIG. 7, one pixel PXL is simplified, showing each electrode as a single layer of electrode and each insulating layer as only a single layer of insulating layer, but the disclosure is not limited thereto.

Referring to FIG. 7, each pixel PXL may include the pixel circuit layer PCL and the display element layer DPL disposed on the substrate SUB.

The pixel circuit layer PCL may include a buffer layer BFL, a transistor T, and a protective layer PSV.

The buffer layer may be provided and/or formed on the substrate SUB, and may prevent an impurity from diffusing into the transistor T. The buffer layer BFL may be an inorganic insulating layer including an inorganic material. The buffer layer BFL may include at least one of a metal oxide such as silicon nitride (SiNx), silicon oxide (SiOx), silicon oxynitride (SiOxNy), or aluminum oxide (AlOx). The buffer layer BFL may be provided as a single layer, or may be provided as a multilayer of at least a double layer. In case that the buffer layer BFL is provided as the multilayer, each layer may be formed of the same material or different materials. The buffer layer BFL may be omitted according to a material, a process condition, and the like of the substrate SUB.

The transistor T may be a driving transistor that controls a driving current provided to the light emitting element LD. However, the disclosure is not limited thereto, and the transistor T may be a switching transistor that transfers a signal to the driving transistor or performs another function in addition to the driving transistor.

The transistor T may include a semiconductor pattern SCL, a gate electrode GE, a first terminal SE, and a second terminal DE. The first terminal SE may be one of a source electrode and a drain electrode, and the second terminal DE may be the other electrode. For example, in case that the first terminal SE is a source electrode, the second terminal DE may be a drain electrode.

The semiconductor pattern SCL may be provided and/or formed on the buffer layer BFL. The semiconductor pattern SCL may include a first contact region contacting the first terminal SE and a second contact region contacting the second terminal DE. A region between the first contact region and the second contact region may be a channel region. The channel region may overlap the gate electrode GE of the corresponding transistor T. The semiconductor pattern SCL may be a semiconductor pattern formed of amorphous silicon, polysilicon, low temperature polysilicon, an oxide semiconductor, an organic semiconductor, or the like. The channel region may be, for example, a semiconductor pattern that is not doped with an impurity, and may be an intrinsic semiconductor. The first contact region and the second contact region may be semiconductor patterns doped with an impurity.

The gate electrode GE may be provided and/or formed on a gate insulating layer GI to correspond to the channel region of the semiconductor pattern SCL. The gate electrode GE may be provided on the gate insulating layer GI and may overlap the channel region of the semiconductor pattern SCL. The gate electrode GE may be formed in a single layer of a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof. The gate electrode GE may be formed in a double layer or multilayer structure of a molybdenum (Mo), titanium (Ti), copper (Cu), aluminum (Al) or silver (Ag), which is a low-resistance material, to reduce a line resistance.

The gate insulating layer GI may be an inorganic insulating layer including an inorganic material. For example, the gate insulating layer GI may include at least one of a metal oxide such as silicon nitride (SiNx), silicon oxide (SiOx), silicon oxynitride (SiOxNy), and aluminum oxide (AlOx). However, the material of the gate insulating layer GI is not limited to the above-described examples, and various materials providing insulation to the gate insulating layer GI may be applied according to an embodiment. For example, the gate insulating layer GI may be formed of an organic insulating layer including an organic material. The gate insulating layer GI may be provided as a single layer, but may also be provided as a multilayer of at least a double layer.

Each of the first terminal SE and the second terminal DE may be provided and/or formed on the second interlayer insulating layer ILD2, and may be in contact with the first contact region and the second contact region of the semiconductor pattern SCL through a contact hole sequentially passing through the gate insulating layer GI and the first and second interlayer insulating layers ILD1 and ILD2. For example, the first terminal SE may contact the first contact region of the semiconductor pattern SCL, and the second terminal DE may contact the second contact region of the semiconductor pattern SCL. Each of the first and second terminals SE and DE may include the same material as the gate electrode GE, or may include one or more materials selected from the material disclosed as the configuration material of the gate electrode GE.

The first interlayer insulating layer ILD1 may include the same material as the gate insulating layer GI, or may include one or more materials selected from the material exemplified as the configuration material of the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. According to an embodiment, the second interlayer insulating layer ILD2 may include the same material as the first interlayer insulating layer ILD1, but the disclosure is not limited thereto. The second interlayer insulating layer ILD2 may be provided as a single layer, or may be provided as a multilayer of at least a double layer. According to an embodiment, the second interlayer insulating layer ILD2 may be omitted.

In the above-described embodiment, the first and second terminals SE and DE of the transistor T are separate electrodes electrically connected to the semiconductor pattern SCL through the contact hole sequentially passing through the gate insulating layer GI and the first and second interlayer insulating layers ILD1 and ILD2, but the disclosure is not limited thereto. According to an embodiment, the first terminal SE of the transistor T may be a first contact region adjacent to the channel region of the semiconductor pattern SCL, and the second terminal DE of the transistor T may be a second contact region adjacent to the channel region of the semiconductor pattern SCL. The second terminal DE of the transistor T may be electrically connected to the light emitting element LD of the pixel PXL through a separate connection means such as a bridge electrode.

The transistor T may be configured of a low temperature polysilicon thin film transistor (LTPS TFT), but the disclosure is not limited thereto. According to an embodiment, the transistors T may include an oxide semiconductor thin film transistor. Although a case in which the transistor T is a thin film transistor of a top gate structure has been described as an example in the above-described embodiment, the disclosure is not limited thereto, and a structure of the transistor T may be variously changed. For example, the transistor T may be a thin film transistor having a bottom gate structure.

The pixel circuit layer PCL may further include a storage capacitor storing a voltage applied between a gate electrode and the first terminal SE (or the source electrode) of the transistor T, a driving voltage line providing a driving voltage to the transistor T (or the pixel PXL), and the like.

The protective layer PSV may be provided and/or formed on the transistor T.

The protective layer PSV may be provided in a form including an organic insulating layer, an inorganic insulating layer, or an organic insulating layer disposed on an inorganic insulating layer. The inorganic insulating layer may include, for example, at least one of a metal oxide such as silicon oxide (SiOx), silicon nitride (SiNx), silicon oxynitride (SiOxNy), or aluminum oxide (AlOx). The organic insulating layer may include, for example, at least one of acrylic resin (polyacrylates resin), epoxy resin, phenolic resin, polyamides resin, polyimide resin, unsaturated polyesters resin, poly-phenylene ethers resin, poly-phenylene sulfides resin, and benzocyclobutene resin.

The display element layer DPL may be provided on the protective layer PSV. The display element layer DPL may include first and second bank patterns BNP1 and BNP2, first and second pixel electrodes PEL1 and PEL2, the light emitting element LD, and first and second connection electrodes CNE1 and CNE2. The display element layer DPL may include first to third insulating layers INS1, INS2, and INS3.

The first and second bank patterns BNP1 and BNP2 may be positioned in the emission area EMA (refer to FIG. 6) and may be spaced apart from each other. The first and second bank patterns BNP1 and BNP2 may be support members that support each of the first and second pixel electrodes BNP1 and BNP2 to change a surface profile (or a shape) of the third direction (Z-axis direction) of each of the first and second pixel electrodes BNP1 and BNP2 so as to guide light emitted from the light emitting elements LD in an image display direction (for example, a front surface direction) of the display device DD. For example, the first and second bank patterns BNP1 and BNP2 may change the surface profile (or the shape) of each of the first and second pixel electrodes PEL1 and PEL2 in the third direction (Z-axis direction).

The first and second bank patterns BNP1 and BNP2 may be provided and/or formed between the protective layer PSV and a corresponding electrode in the emission area of a corresponding pixel PXL. For example, the first bank pattern BNP1 may be provided and/or formed between the protective layer PSV and the first pixel electrode PEL1, and the second bank pattern BNP2 may be provided and/or formed between the protective layer PSV and the second pixel electrode PEL2.

The first and second bank patterns BNP1 and BNP2 may be an inorganic insulating layer including an inorganic material or an organic insulating layer including an organic material. According to an embodiment, the first and second bank patterns BNP1 and BNP2 may include a single organic insulating layer and/or a single inorganic insulating layer, but the disclosure is not limited thereto. According to an embodiment, the first and second bank patterns BNP1 and BNP2 may be provided in a form of a multilayer in which at least one organic insulating layer and at least one inorganic insulating layer are stacked on each other. However, the material of the first and second bank patterns BNP1 and BNP2 is not limited to the above-described embodiments.

The first and second bank patterns BNP1 and BNP2 may have a trapezoidal shape of cross-section in which a width becomes narrower from one surface (for example, an upper surface) of the protective layer PSV toward an upper portion along the third direction (Z-axis direction), but the disclosure is not limited thereto. According to an embodiment, the first and second bank patterns BNP1 and BNP2 may include a curved surface having a cross-section of a semi-elliptical shape, a semi-circular shape (or a hemispherical shape). A cross-sectional shape of the first and second bank patterns BNP1 and BNP2 is not limited to the above-described embodiments and may be variously changed within a range capable of improving efficiency of the light emitted from each of the light emitting elements LD. The first and second bank patterns BNP1 and BNP2 adjacent in the first direction (X-axis direction) may be disposed on the same surface of the protective layer PSV, and may have a same height (or thickness) in the third direction (Z-axis direction).

In the above-described embodiment, the first and second bank patterns BNP1 and BNP2 are provided and/or formed on the protective layer PSV, and thus the first and second bank patterns BNP1 and BNP2 and the protective layer PSV may be formed by different processes, but the disclosure is not limited thereto. According to an embodiment, the first and second bank patterns BNP1 and BNP2 and the protective layer PSV may be formed through the same process. The first and second bank patterns BNP1 and BNP2 may be one region of the protective layer PSV.

The first and second pixel electrodes PEL1 and PEL2 may be provided and/or formed on the respectively overlapping first and second bank patterns BNP1 and BNP2.

Each of the first and second pixel electrodes PEL1 and PEL2 may be formed of a reflective material in order to allow the light emitted from the light emitting element LD to proceed in the image display direction of the display device DD. Each of the first and second pixel electrodes PEL1 and PEL2 may be formed of a reflective conductive material. The conductive material may include an opaque metal advantageous for reflecting the light emitted from the light emitting element LD in the image display direction of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Jr), chromium (Cr), titanium (Ti), and/or an alloy thereof. According to an embodiment, each of the first and second pixel electrodes PEL1 and PEL2 may include a transparent conductive material. The transparent conductive material may include a conductive oxide such as indium tin oxide (ITO), indium zinc oxide (IZO), indium gallium zinc oxide (IGZO), or indium tin zinc oxide (ITZO), a conductive polymer such as poly(3,4-ethylenedioxythiophene) (PEDOT), and the like.

In case that each of the first and second pixel electrodes PEL1 and PEL2 includes a transparent conductive material, a separate conductive layer formed of an opaque metal for reflecting the light emitted from the light emitting element LD in the image display direction of the display device DD may be added. However, the material of each of the first and second pixel electrodes PEL1 and PEL2 is not limited to the above-described materials.

Each of the first and second pixel electrodes PEL1 and PEL2 may be provided and/or formed as a single layer, but the disclosure is not limited thereto. According to an embodiment, each of the first and second pixel electrodes PEL1 and PEL2 may be provided and/or formed as a multilayer in which at least two or more materials among metals, alloys, conductive oxides, and conductive polymers are stacked on each other. Each of the first and second pixel electrodes PEL1 and PEL2 may be formed of a multilayer of a double or more layers to minimize distortion due to a signal delay in case transferring a signal (or a voltage) to both ends of each of the light emitting elements LD. For example, each of the first and second pixel electrodes PEL1 and PEL2 may be formed in a multilayer in which indium tin oxide (ITO)/silver (Ag)/indium tin oxide (ITO) are sequentially stacked.

According to an embodiment, the first pixel electrode PEL1 may be electrically connected to the transistor T through a first contact hole passing through the protective layer PSV, and the second pixel electrode PEL2 may be electrically connected to a driving voltage line of the pixel circuit layer PCL through a second contact hole passing through the protective layer PSV.

Each of the first pixel electrode PEL1 and the second pixel electrode PEL2 may be used as alignment electrodes (or alignment lines) that receive an alignment signal (or an alignment voltage) from a corresponding partial configuration of the pixel circuit layer PCL to align the light emitting elements LD. For example, the first pixel electrode PEL1 may receive a first alignment signal (or a first alignment voltage) from a partial configuration of the pixel circuit layer PCL and may be used as a first alignment electrode (or a first alignment line), and the second pixel electrode PEL2 may receive a second alignment signal (or a second alignment voltage) from another configuration of the pixel circuit layer PCL and may be used as a second alignment electrode (or a second alignment line).

After the light emitting element LD is aligned in the pixel PXL, a portion of the first pixel electrode PEL1 positioned between adjacent pixels PXL may be removed to individually (or independently) drive the pixel PXL.

After the light emitting element LD is aligned, the first pixel electrode PEL1 and the second pixel electrode PEL2 may be used as driving electrodes for driving the light emitting elements LD.

At least two to tens of light emitting elements LD may be arranged and/or provided in the emission area EMA, but the number of light emitting elements LD arranged and/or provided in the emission area EMA is not limited thereto. According to an embodiment, the number of light emitting elements LD arranged and/or provided in the emission area EMA may be variously changed.

Each of the light emitting elements LD may emit any one of color light and/or white light. In an embodiment, each of the light emitting elements LD may emit blue light of a short wavelength band, but the disclosure is not limited thereto.

The first insulating layer INS1 may be provided and/or formed on the first and second pixel electrodes PEL1 and PEL2.

The first insulating layer INS1 may include an inorganic insulating layer formed of an inorganic material or an organic insulating layer formed of an organic material. The first insulating layer INS1 may be formed of an inorganic insulating layer advantageous for protecting the light emitting element LD from the pixel circuit layer PCL of the pixel PXL. For example, the first insulating layer INS1 may include at least one of a metal oxide such as silicon nitride ($SiN_x$), silicon oxide ($SiO_x$), silicon oxynitride ($SiO_xN_y$), and aluminum oxide ($AlO_x$), but the disclosure is not limited thereto. According to an embodiment, the first insulating layer INS1 may be formed of an organic insulating layer for planarization of a support surface of the light emitting elements LD.

The first insulating layer INS1 may include a first opening OPN1 exposing one region of the first pixel electrode PEL1 and a second opening OPN2 exposing one region of the second pixel electrode PEL2. The first insulating layer INS1 may cover remaining regions except for one region of each of the first and second pixel electrodes PEL1 and PEL2 (that is, the regions corresponding to the first and second openings OPN1 and OPN2). The light emitting elements LD may be disposed (or aligned) on the first insulating layer INS1 between the first pixel electrode PEL1 and the second pixel electrode PEL2.

The second insulating layer INS2 (or a second insulating pattern) may be provided and/or formed on the light emitting element LD. The second insulating layer INS2 may be provided and/or formed on the light emitting element LD to partially cover an outer circumferential surface (or a surface) of the light emitting element LD. The active layer of the light emitting element LD may not contact an external conductive material by the second insulating layer INS2. The second insulating layer INS2 may cover only a portion of the outer peripheral surface (or the surface) of the light emitting element LD to expose the ends of the light emitting element LD to the outside.

The second insulating layer INS2 may be configured of a single layer or a multilayer, and may include an inorganic insulating layer including at least one inorganic material or an organic insulating layer including at least one organic material. According to an embodiment, the second insulating layer INS2 may be formed of an inorganic insulating layer including an inorganic material or an organic insulating layer including an organic material. After the alignment of the light emitting element LD is completed in the pixel PXL, the second insulating layer INS2 may be formed on the light emitting element LD to prevent the light emitting element LD from being separated from an aligned position.

The first connection electrode CNE1 may be provided on the first pixel electrode PEL1 to be in contact or to be connected to the first pixel electrode PEL1 through the first opening OPN1 of the first insulating layer INS1. According to an embodiment, in case that a capping layer (not shown) is disposed on the first pixel electrode PEL1, the first connection electrode CNE1 may be disposed on the capping layer and may be connected to the first pixel electrode PEL1 through the capping layer. The above-described capping layer may protect the first pixel electrode PEL1 from a defect or the like generated during a manufacturing process of the display device DD, and may further strengthen adhesion force between the first pixel electrode PEL1 and the pixel circuit layer PCL positioned thereunder. The capping layer may include a transparent conductive material (or substance) such as indium zinc oxide (IZO).

The first connection electrode CNE1 may be provided and/or formed on one end of the light emitting element LD to be connected to the one end of the light emitting element LD. Accordingly, the first pixel electrode PEL1 and the one end of the light emitting element LD may be electrically connected to each other through the first connection electrode CNE1.

Similarly to the first connection electrode CNE1, the second connection electrode CNE2 may be provided on the second pixel electrode PEL2 to be in contact or to be connected to the second pixel electrode PEL2 through the second opening OPN2 of the first insulating layer INS1.

According to an embodiment, in case that a capping layer is disposed on the second pixel electrode PEL2, the second connection electrode CNE2 may be disposed on the capping layer and may be connected to the second pixel electrode PEL2 through the capping layer. The second connection electrode CNE2 may be provided and/or formed on the other end of the light emitting element LD to be connected to the other end of the light emitting element LD. Accordingly, the second pixel electrode PEL2 and the other end of the light emitting element LD may be electrically connected to each other through the second connection electrode CNE2.

The first and second connection electrodes CNE1 and CNE2 may be formed of various transparent conductive materials to allow light emitted from the light emitting element LD and reflected by the first and second pixel electrodes PEL1 and PEL2 to proceed in the image display direction of the display device DD without loss. For example, the first and second connection electrodes CNE1 and CNE2 may include at least one of various transparent conductive materials (or substances) including indium tin oxide (ITO), indium zinc oxide (IZO), indium gallium zinc oxide (IGZO), indium tin zinc oxide (ITZO), and the like, and may be configured to be substantially transparent or translucent to satisfy a light transmittance (or transmittance). However, the material of the first and second connection electrodes CNE1 and CNE2 is not limited to the above-described embodiment. According to an embodiment, the first and second connection electrodes CNE1 and CNE2 may be formed of various opaque conductive materials (or substances). The first and second connection electrodes CNE1 and CNE2 may be formed as a single layer or multiple layers.

A shape of the first and second connection electrodes CNE1 and CNE2 may not be limited to a specific shape, and may be variously changed within a range electrically and stably connected to the light emitting element LD. The shape of the first and second connection electrodes CNE1 and CNE2 may be variously changed in consideration of a connection relationship with electrodes disposed thereunder.

The first and second connection electrodes CNE1 and CNE2 may be disposed to be spaced apart from each other in the first direction (X-axis direction). For example, the first connection electrode CNE1 and the second connection electrode CNE2 may be disposed to be spaced apart from each other with a distance (e.g., a predetermined or a selectable distance) therebetween on the second insulating layer INS2. The first connection electrode CNE1 and the second connection electrode CNE2 may be provided on the same layer and may be formed through a same process. However, the disclosure is not limited thereto, and according to an embodiment, the first and second connection electrodes CNE1 and CNE2 may be provided on different layers and may be formed through different processes.

The third insulating layer INS3 may be provided and/or formed on the first and second connection electrodes CNE1 and CNE2. The third insulating layer INS3 may be an inorganic insulating layer including an inorganic material or an organic insulating layer including an organic material. For example, the third insulating layer INS3 may have a structure in which at least one inorganic insulating layer or at least one organic insulating layer is alternately stacked. The third insulating layer INS3 may entirely cover the display element layer DPL to prevent water, moisture, or the like from flowing into the display element layer DPL including the light emitting elements LD from the outside.

Figure 8:
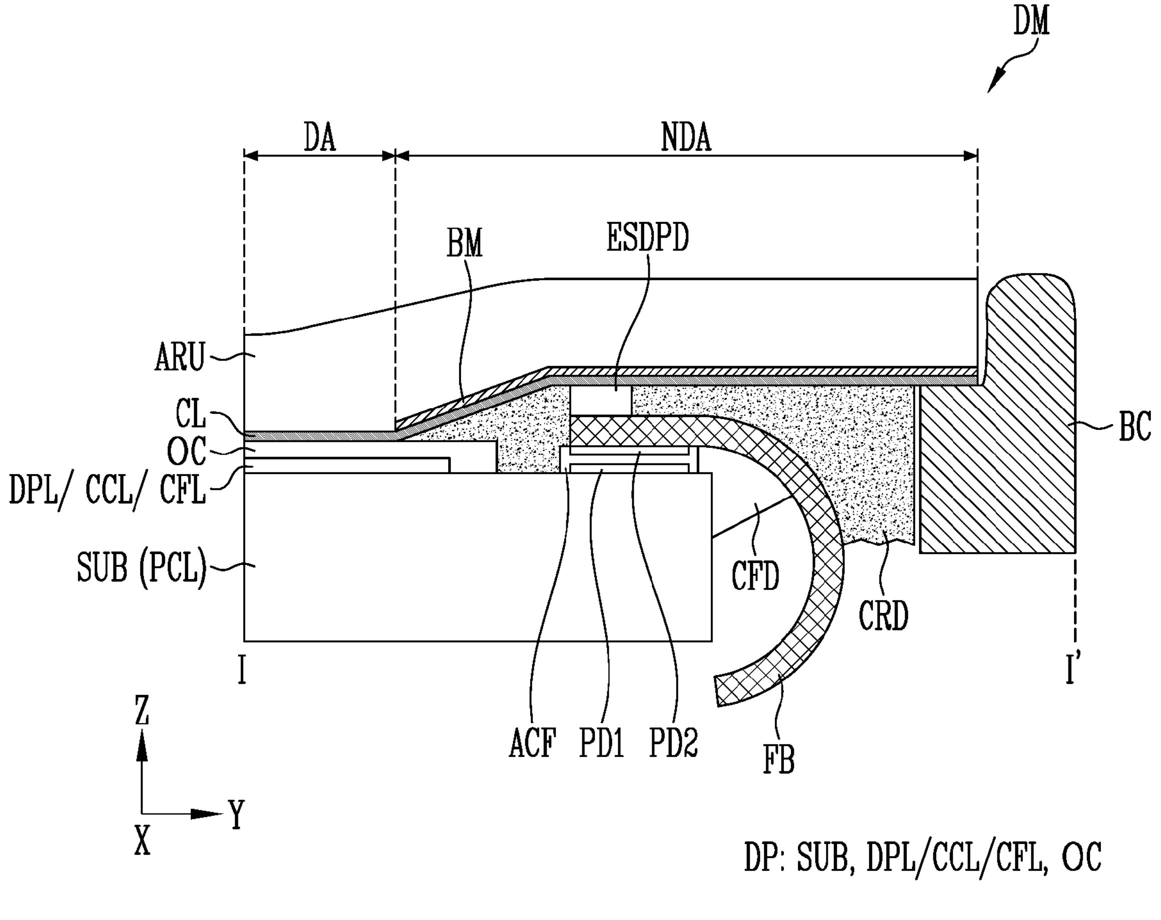
FIGS. 8 and 9 are each schematic cross-sectional views taken along line I~I' of FIG. 2.
Figure 9:
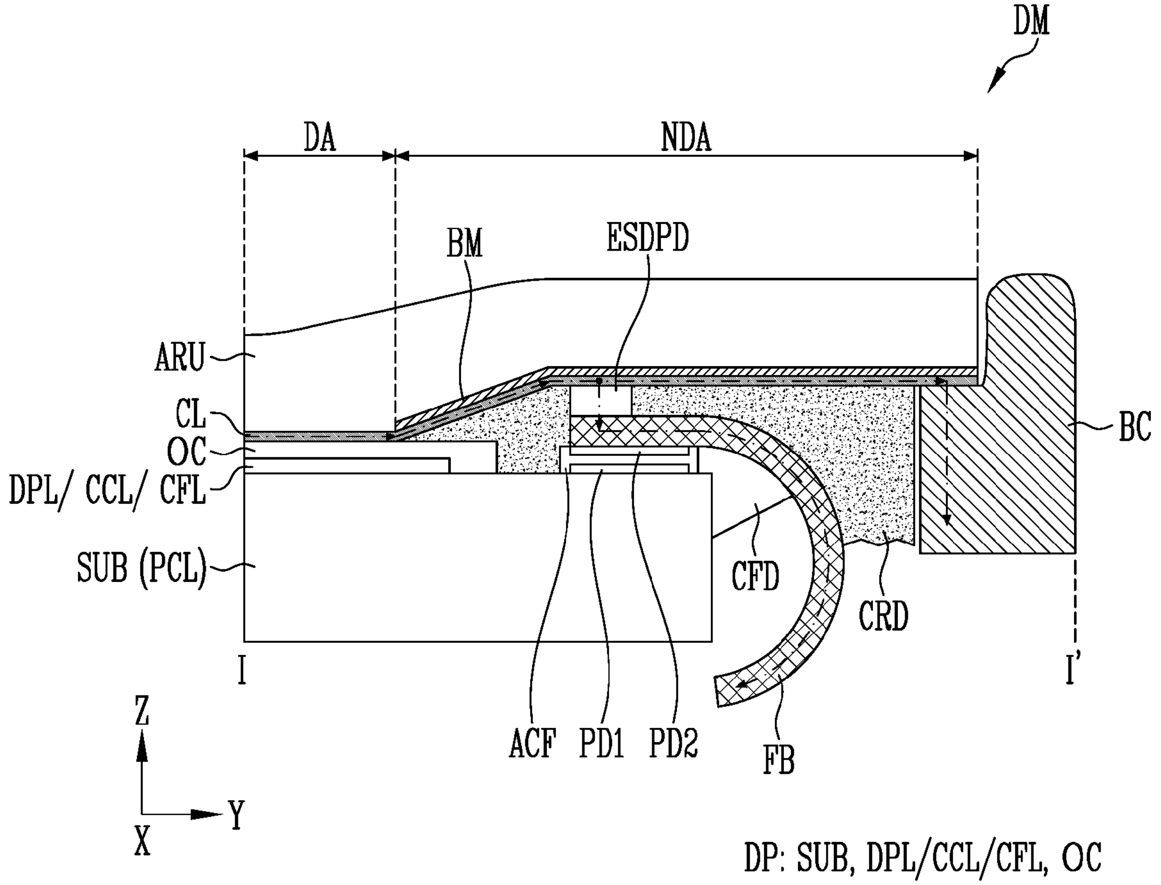

FIGS. 8 and 9 are each schematic cross-sectional views taken along line I~I' of FIG. 2. FIG. 9 illustrates a path through which static electricity generated in the optical layer is discharged.

Referring to FIGS. 8 and 9, the display module DM may include the display panel DP, the circuit board FB, the optical layer ARU, and/or the conductive layer CL.

The display panel DP may include the substrate SUB, the display element layer DPL (the pixel circuit layer PCL, the color conversion layer CCL, and/or the color filter layer CFL) including the pixels PXL (refer to FIGS. 3 and 7) provided on the substrate SUB, and the overcoat layer OC covering the display element layer DPL. The display panel DP may include the first pads PD1 positioned on one surface of the substrate SUB.

The overcoat layer OC may be a planarization layer that alleviates a step caused by configurations included in the display panel DP disposed thereunder. The overcoat layer OC may be a protective means that covers the display panel DP to protect the pixels PXL. To this end, the overcoat layer OC may be formed of an organic insulating layer including an organic material. The organic insulating layer may include, for example, at least one of acrylic resin (polyacrylates resin), epoxy resin, phenolic resin, polyamides resin, polyimides resin, unsaturated polyesters resin, polyphenylene ethers resin, polyphenylene sulfides resin, and benzocyclobutene resin. However, the material of the overcoat layer OC is not limited to the above-described materials.

The circuit board FB may be disposed on one side of the display panel DP so that one surface on which the second pads PD2 are positioned faces the first pads PD1. The second pads PD2 of the circuit board FB may be electrically connected to the first pads PD1 of the display panel DP through the conductive adhesive member ACF. The circuit board FB may be folded along one side of the display module DM to be positioned on a rear surface of the display module DM.

A lower protective layer CFD (a lower cover layer, or a lower protective member) may be disposed on a lower surface of the circuit board FB. The lower protective layer CFD may be partially positioned under the circuit board FB attached to one side of the display panel DP to correspond to a bonding coupling portion of the circuit board FB and the display panel DP. The lower protective layer CFD may cover the bonding coupling portion of the circuit board FB and the display panel DP. The lower protective layer CFD may protect the bonding coupling portion and may block external water, moisture, and the like from flowing into the bonding coupling portion and proceeding to an inside of the display panel DP. The bonding coupling portion of the circuit board FB and the display panel DP may be a position where the second pads PD2 of the circuit board FB and the first pads PD1 of the display panel DP are mutually coupled through the conductive adhesive member ACF.

The lower protective layer CFD may be formed of a resin. For example, the lower protective layer CFD may be formed of a thermosetting resin including a thermal polymerization initiator that initiates a curing reaction by heat. According to an embodiment, the lower protective layer CFD may be formed of a light-curable resin including a photopolymerization initiator that is crosslinked and cured by light such as ultraviolet light or infrared light.

The optical layer ARU may be provided on the display panel DP and the circuit board FB. The optical layer ARU may be an anti-reflection layer for preventing external light from being viewed. The optical layer ARU may cover the display panel DP and the circuit board FB. The optical layer ARU may be partially disposed on the receiving member BC by protruding outward from the display panel DP (and the circuit board FB). The upper protective layer CRD may be disposed between the optical layer ARU and the display panel DP. For example, the upper protective layer CRD may be filled in a space in which the optical layer ARU and the display panel DP are spaced apart. The upper protective layer CRD may be disposed between the optical layer ARU and the circuit board FB. For example, the upper protective layer CRD may be filled in a space in which the optical layer ARU and the circuit board FB are spaced apart.

The upper protective layer CRD may support the optical layer ARU. The upper protective layer CRD may protect the bonding coupling portion of the display panel DP and the circuit board FB together with the lower protective layer CFD, and may block external water, moisture, and the like from being input to the bonding coupling portion and proceeding to an inside of the display panel DP.

The conductive layer CL may be disposed on one surface of the optical layer ARU. For example, the conductive layer CL may be disposed on one surface of the optical layer ARU facing the circuit board FB. In the display area DA, the conductive layer CL may be disposed between the optical layer ARU and the overcoat layer OC. In the non-display area NDA, the conductive layer CL may be disposed between the optical layer ARU and the circuit board FB. The conductive layer CL may be disposed between the optical layer ARU and the upper protective layer CRD. The upper protective layer CRD may be provided between the conductive layer CL and the circuit board FB to at least partially cover the conductive layer CL.

The conductive layer CL may serve to provide a path for discharging static electricity generated in the optical layer ARU. To this end, the conductive layer CL may be electrically connected to the circuit board FB. For example, an electrostatic pad ESDPD may be disposed between the conductive layer CL and the circuit board FB. The conductive layer CL may be electrically connected to the circuit board FB through the electrostatic pad ESDPD. Accordingly, as shown in FIG. 9, the static electricity generated in the optical layer ARU may be transferred to the circuit board FB through the conductive layer CL and discharged from the circuit board FB.

In order to doubly discharge the static electricity generated in the optical layer ARU, the conductive layer CL may be electrically connected to the receiving member BC. For example, the conductive layer CL may at least partially overlap the receiving member BC to contact the receiving member BC. Accordingly, as shown in FIG. 9, the static electricity generated in the optical layer ARU may be transferred to the receiving member BC through the conductive layer CL and discharged from the receiving member BC. Therefore, since the static electricity generated in the optical layer ARU may be doubly discharged in the circuit board FB and the receiving member BC through the conductive layer CL, damage due to the static electricity may be minimized. In FIG. 9, the state electricity discharge path(s) may be shown by the dashed lines which include one or more arrows.

The conductive layer CL may include a transparent conductive material. The transparent conductive material may include a conductive oxide such as indium tin oxide (ITO), indium zinc oxide (IZO), indium gallium zinc oxide (IGZO), and indium tin zinc oxide (ITZO), a conductive polymer such as poly(3,4-ethylenedioxythiophene) (PEDOT), and the like.

A light blocking pattern BM may be disposed between the optical layer ARU and the conductive layer CL. The light blocking pattern BM may overlap the non-display area NDA. The light blocking pattern BM may prevent the circuit board FB or the like from being viewed in the non-display area NDA.

The light blocking pattern BM may include a light blocking material such as a black matrix. For example, the light blocking pattern BM may be formed of a ceramic, a metal, an organic layer, and/or an inorganic layer. The light blocking material may include a material based on carbon black, titanium black, iron sulfide, or the like, but the light blocking material is not limited thereto.

According to the above-described embodiment, since the static electricity generated in the optical layer ARU may be doubly discharged from the circuit board FB and the receiving member BC through the conductive layer CL, damage due to the static electricity may be minimized.

Hereinafter, another embodiment is described. In the following embodiment, the same configurations as those already described are referred to by the same reference numerals, and similar content may be omitted or briefly described.

Figure 10:
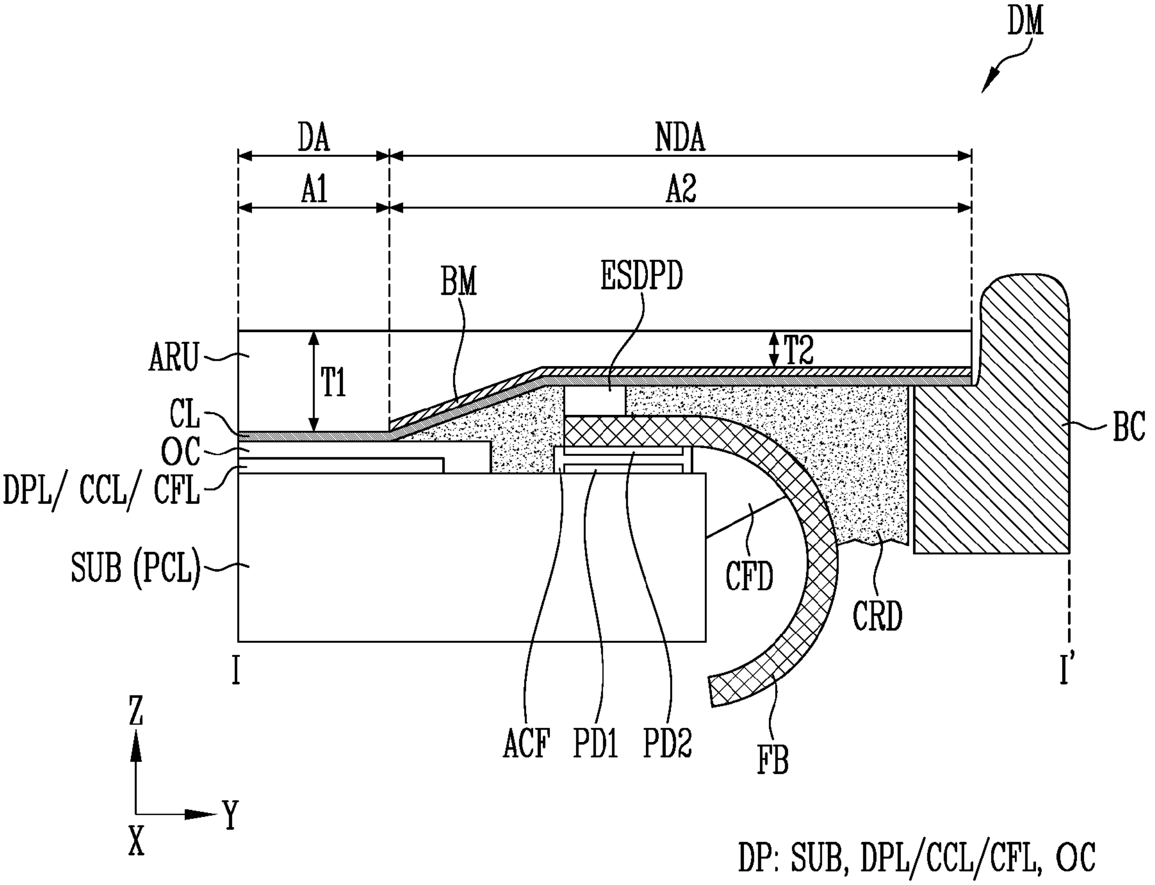
FIG. 10 is a schematic cross-sectional view illustrating a display module according to an embodiment.

FIG. 10 is a schematic cross-sectional view illustrating a display module according to an embodiment.

Referring to FIG. 10, the optical layer ARU may include a first area A1 having a first thickness T1 and a second area A2 having a second thickness T2 less than the first thickness T1. The first area A1 of the optical layer ARU may overlap the display area DA, and the second area A2 of the optical layer ARU may overlap the non-display area NDA, but the disclosure is not limited thereto. The second area A2 of the optical layer ARU may overlap the first pad PD1, the second pad PD2, and/or the electrostatic pad ESDPD. As described above, by forming the second thickness T2 of the second area A2 of the optical layer ARU overlapping the pads PD1, PD2, and ESDPD to be relatively small, an upper surface of the optical layer ARU may be formed to be flat by compensating for a step difference due to the pads PD1, PD2, and ESDPD.

The upper protective layer CRD may be disposed between the second area A2 of the optical layer ARU and the display panel DP. For example, the upper protective layer CRD may be filled in a space in which the second area A2 of the optical layer ARU and the display panel DP are spaced apart. The upper protective layer CRD may be disposed between the second area A2 of the optical layer ARU and the circuit board FB. For example, the upper protective layer CRD may be filled in a space in which the second area A2 of the optical layer ARU and the circuit board FB are spaced apart.

The light blocking pattern BM may overlap the second area A2 of the optical layer ARU. The light blocking pattern BM may overlap the non-display area NDA. The light blocking pattern BM may prevent the circuit board FB from being viewed in the non-display area NDA.

Figure 11:
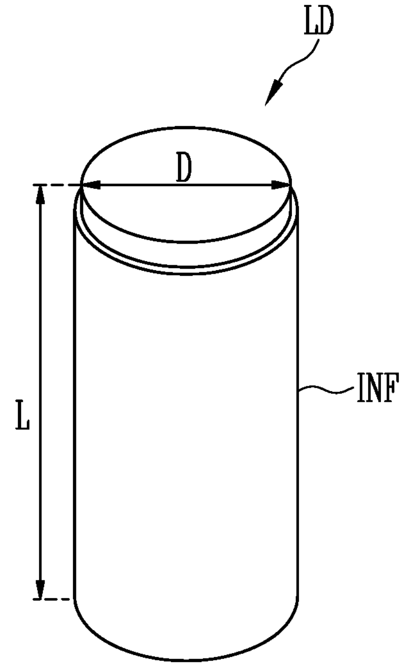
FIG. 11 is a schematic perspective view illustrating a light emitting element according to an embodiment.
Figure 12:
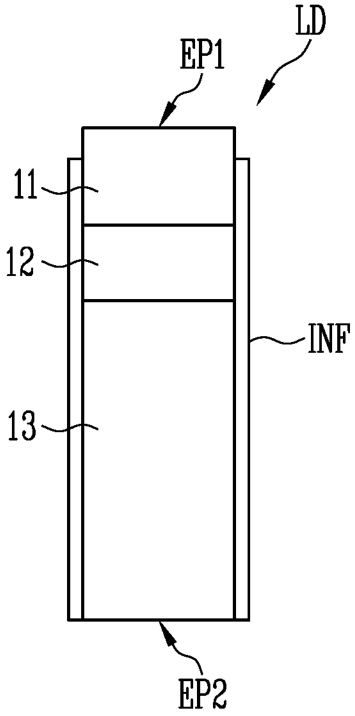
FIG. 12 is a schematic cross-sectional view illustrating a light emitting element according to an embodiment.

FIG. 11 is a schematic perspective view illustrating a light emitting element according to an embodiment. FIG. 12 is a schematic cross-sectional view illustrating a light emitting element according to an embodiment. FIGS. 11 and 12 show a column shape of light emitting element LD, a type and/or a shape of the light emitting element LD applicable to the above-described display device DD should not be limited thereto.

Referring to FIGS. 11 and 12, the light emitting element LD may include a first semiconductor layer 11, and/or an active layer 12, a second semiconductor layer 13.

The light emitting element LD may be formed in a column shape extending along one direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, the light emitting element LD may be a light emitting element manufactured in a column shape through an etching method or the like. In the specification, the column shape may include a rod-like shape or a bar-like shape of which an aspect ratio is greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, or AlN, and may include a p-type semiconductor layer doped with a first conductivity type dopant such as Mg. However, a material configuring the first semiconductor layer 11 is not limited thereto, and various other materials may configure the first semiconductor layer 11.

The active layer 12 may be disposed between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but is not limited thereto. The active layer 12 may include GaN, InGaN, InAlGaN, AlGaN, or AlN, and various other materials may configure the active layer 12.

In case that a voltage equal to or greater than a threshold voltage is applied to both ends of the light emitting element LD, an electron-hole pair is combined in the active layer 12 and thus the light emitting element LD emits light. By controlling emission of the light emitting element LD using such a principle, the light emitting element LD may be used as a light source of various light emitting devices including the pixel PXL of the display device DD.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, and AlN, and may include an n-type semiconductor layer doped with a second conductivity type dopant such as Si, Ge, and Sn. However, a material configuring the second semiconductor layer 13 is not limited thereto, and various other materials may configure the second semiconductor layer 13.

According to an embodiment, an electrode layer may be further disposed on the first end EP1 and/or the second end EP2 of the light emitting element LD3. The electrode layer may include a transparent metal or a transparent metal oxide. For example, the electrode layer may include at least one of indium tin oxide (ITO), indium zinc oxide (IZO), and zinc tin oxide (ZTO), but is not limited thereto. As described above, in case that the electrode layer is formed of the transparent metal or the transparent metal oxide, light generated in the active layer 12 of the light emitting element LD may pass through the electrode layer and may be emitted outside of the light emitting element LD.

An insulating film INF may be provided on a surface of the light emitting element LD. The insulating film INF may be disposed (e.g., directly disposed) on a surface of the first semiconductor layer 11, the active layer 12, and/or the second semiconductor layer 13. The insulating film INF may expose the first and second ends EP1 and EP2 of the light emitting element LD having different polarities. According to an embodiment, the insulating film INF may expose a side portion of the first semiconductor layer 11 and/or the second semiconductor layer 13 adjacent to the first and second ends EP1 and EP2 of the light emitting element LD.

The insulating film INF may prevent an electrical short that may occur in case that the active layer 12 comes into contact with a conductive material except for the first and second semiconductor layers 11 and 13. The insulating film INF may minimize a surface defect of the light emitting elements LD, thereby improving lifespan and emission efficiency of the light emitting elements LD.

The insulating film INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). For example, the insulating film INF may be configured as double layers, and each layer configuring the double layers may include different materials. For example, the insulating film INF may be configured as double layers configured of aluminum oxide (AlOx) and silicon oxide (SiOx), but is not limited thereto. According to an embodiment, the insulating film INF may be omitted.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device comprising:

a display panel disposed in a receiving member;

a circuit board coupled to the display panel;

an optical layer on the display panel;

a conductive layer on one surface of the optical layer facing the circuit board; and a pad disposed between the conductive layer and the circuit board, wherein the conductive layer contacts the receiving member, and is electrically connected to the receiving member.

2. The display device according to claim 1, wherein the display panel comprises:

a display element layer including a light emitting element;

a color filter layer on the display element layer; and an overcoat layer on the color filter layer.

3. The display device according to claim 2, wherein the conductive layer is disposed between the optical layer and the overcoat layer.

4. The display device according to claim 1, wherein the conductive layer is electrically connected to the circuit board through the pad.

5. The display device according to claim 1, wherein the receiving member includes a conductive material.

6. The display device according to claim 1, wherein the display panel includes a display area including pixels and a non-display area surrounding at least one side of the display area.

7. The display device according to claim 6, further comprising:

a light blocking pattern overlapping the non-display area in a plan view.

8. The display device according to claim 7, wherein the light blocking pattern is disposed between the optical layer and the conductive layer.

9. The display device according to claim 1, further comprising:

a protective layer at least partially covering the display panel and the circuit board.

10. The display device according to claim 9, wherein the protective layer is disposed between the conductive layer and the circuit board.

11. A display device comprising:

a display panel disposed in a receiving member;

a circuit board coupled to the display panel;

an optical layer on the display panel;

a conductive layer disposed on one surface of the optical layer and electrically connected to the receiving member; and a pad disposed between the conductive layer and the circuit board, wherein the optical layer includes a first area having a first thickness and a second area having a second thickness less than the first thickness, and the second area of the optical layer overlaps the pad in a plan view.

12. The display device according to claim 11, further comprising:

a light blocking pattern overlapping the second area of the optical layer in a plan view.

13. The display device according to claim 12, wherein the light blocking pattern is disposed between the optical layer and the conductive layer.

14. The display device according to claim 11, further comprising:

a protective layer disposed between the second area of the optical layer and the circuit board.

15. The display device according to claim 14, wherein the protective layer at least partially covers the conductive layer.

16. The display device according to claim 11, wherein the display panel comprises:

a display element layer including a light emitting element;

a color filter layer on the display element layer; and an overcoat layer on the color filter layer.

17. The display device according to claim 16, wherein the conductive layer is disposed between the overcoat layer and the optical layer.

18. The display device according to claim 16, wherein the light emitting element comprises:

a first semiconductor layer;

a second semiconductor layer; and an active layer disposed between the first semiconductor layer and the second semiconductor layer.

19. The display device according to claim 11, wherein the receiving member includes a conductive material.

20. The display device according to claim 11, wherein the conductive layer contacts the receiving member.

* * * * *